(12) United States Patent
Hsu et al.

(10) Patent No.: US 11,195,905 B2
(45) Date of Patent: Dec. 7, 2021

(54) METAL-OXIDE-SEMICONDUCTOR TRANSISTOR AND METHOD OF FABRICATING THE SAME

(71) Applicant: United Microelectronics Corp., Hsinchu (TW)

(72) Inventors: Hsiang-Hua Hsu, Kaohsiung (TW); Liang-An Huang, Tainan (TW); Sheng-Chen Chung, Tainan (TW); Chen-An Kuo, Taoyuan (TW); Chiu-Te Lee, Hsinchu County (TW); Chih-Chung Wang, Hsinchu (TW); Kuang-Hsiu Chen, Tainan (TW); Ke-Feng Lin, Taipei (TW); Yan-Huei Li, Taichung (TW); Kai-Ting Hu, Changhua County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/358,556

(22) Filed: Mar. 19, 2019

(65) Prior Publication Data
US 2020/0266267 A1 Aug. 20, 2020

(30) Foreign Application Priority Data
Feb. 20, 2019 (CN) .......................... 201910125919.6

(51) Int. Cl.
| H01L 29/06 | (2006.01) |
| H01L 21/265 | (2006.01) |
| H01L 29/66 | (2006.01) |
| H01L 29/778 | (2006.01) |

(52) U.S. Cl.
CPC .... *H01L 29/0615* (2013.01); *H01L 21/26513* (2013.01); *H01L 29/66477* (2013.01); *H01L 29/778* (2013.01)

(58) Field of Classification Search
None
See application file for complete search history.

(56) References Cited

U.S. PATENT DOCUMENTS

| 6,452,231 B1 | 9/2002 | Nakagawa et al. |
| 7,394,116 B2 | 7/2008 | Kim et al. |
| 9,105,508 B2* | 8/2015 | Kang ................. H01L 29/4238 |
| 2008/0173906 A1* | 7/2008 | Zhu .................. H01L 29/66621 |
| | | 257/255 |
| 2009/0001482 A1* | 1/2009 | Kang ................ H01L 27/10894 |
| | | 257/390 |

(Continued)

OTHER PUBLICATIONS

"Search Report of Europe Counterpart Application", dated Jun. 22, 2020, p. 1-p. 8.

*Primary Examiner* — Long Pham
(74) *Attorney, Agent, or Firm* — J.C. Patents

(57) ABSTRACT

A metal-oxide-semiconductor (MOS) transistor includes a substrate. The substrate has a plurality of trenches extending along a first direction and located on a top portion of the substrate. A gate structure line is located on the substrate and extends along a second direction intersecting with the first direction and crossing over the trenches. A first doped line is located in the substrate, located at a first side of the gate structure line, and crosses over the trenches. A second doped line is located in the substrate, located at a second side of the gate structure line, and crosses over the trenches.

18 Claims, 8 Drawing Sheets

(56) References Cited

U.S. PATENT DOCUMENTS

2011/0156136 A1 6/2011 Amari
2011/0177663 A1* 7/2011 Kachi ................ H01L 29/7811
　　　　　　　　　　　　　　　　　　438/272

* cited by examiner

METAL-OXIDE-SEMICONDUCTOR TRANSISTOR AND METHOD OF FABRICATING THE SAME

CROSS REFERENCE TO RELATED APPLICATION

This application claims the priority benefit of China application serial no. 201910125919.6, filed on Feb. 20, 2019. The entirety of the above-mentioned patent application is hereby incorporated by reference herein and made a part of specification.

TECHNICAL FIELD

The disclosure relates to a semiconductor fabrication technology. More particularly, the disclosure relates to a metal-oxide-semiconductor (MOS) transistor and a method of fabricating the same.

DESCRIPTION OF RELATED ART

As functions of an integrated circuit (IC) increase, a portion of the IC operates in a relatively high voltage range, thus enhancing the overall functions of the IC. Although a metal-oxide semiconductor (MOS) transistor operating at a high voltage is constituted by a gate, a source, and a drain, the structure of the MOS transistor is different, so that the current flowing through a channel region may be increased when the transistor operating at the high voltage is turned on.

The gate of the MOS transistor is configured to control whether the channel region of a substrate is in an on state or an off state. When the MOS transistor is applied at a high voltage, the area of the channel region constituted by a polysilicon gate and the substrate poses an impact on the performance of the MOS transistor.

In the structure of an exemplary high voltage transistor is taken as an example, the gate between the source and the drain has a linear structure configured to increase an effective width of the gate. The gate forms the channel region on the substrate, and a current is allowed to flow through the channel region. The effective width of the gate, as a matter of fact, corresponds to an effective width of the channel. Here, according to the normal definition, the direction between the source and the drain is a length direction, which is directed to the length of the channel; by contrast, the effective width of the gate indicates an extension length in a direction perpendicular to the direction of the length of the channel. If the effective width (Weff) of the gate increases, the current (Ion) of the turned-on transistor increases as well.

In the MOS transistor having said structural design, especially the transistor operating at the high voltage, how to increase the effective width of the gate to enhance the operating performance of the transistor should be taken into account.

SUMMARY

The disclosure provides a metal-oxide semiconductor (MOS) transistor whose gate structure in a width direction has a concave portion down into the substrate, so as to increase an effective width of the gate.

According to an embodiment of the disclosure, an MOS transistor including a substrate is provided. The substrate has a plurality of trenches extending along a first direction and located on a top portion of the substrate. A gate structure line is located on the substrate and extends along a second direction intersecting with the first direction and crossing over the trenches. A first doped line is located in the substrate, located at a first side of the gate structure line, and crosses over the trenches. A second doped line is located in the substrate, located at a second side of the gate structure line, and crosses over the trenches.

In an embodiment, the first direction is perpendicular to the second direction.

In an embodiment, a depth of the trenches is within a range from 100 angstroms to 700 angstroms.

In an embodiment, a depth of the trenches is within a range from 300 angstroms to 400 angstroms.

In an embodiment, a width of the trenches is equal to a distance between two adjacent trenches of the trenches.

In an embodiment, a width of the trenches is at least 250 nm.

In an embodiment, the substrate includes a deep p-type well, and the first doped line and the second doped line are formed in the deep p-type well.

In an embodiment, the first doped line is a p type, and the second doped line is an n type.

In an embodiment, the gate structure line includes: a gate insulation layer located on the substrate and a gate line layer located on the gate insulation layer.

In an embodiment, the gate line layer is a polysilicon layer.

According to an embodiment of the disclosure, a method of fabricating an MOS transistor is provided, and the method includes: providing a substrate having a plurality of trenches extending along a first direction and located on a top portion of the substrate. A gate structure line is formed on the substrate, and the gate structure line extends along a second direction intersecting with the first direction and crossing over the trenches. Implantation is performed on the substrate to form a first doped line and a second doped line in the substrate, and the first doped line and the second doped line extend along a second direction intersecting with the first direction and crossing over the trenches. A gate structure line is formed on the substrate, extends along the second direction, and crosses over the trenches, wherein the first doped line is located at a first side of the gate structure line, and the second doped line is located at a second side of the gate structure line.

In an embodiment, the first direction is perpendicular to the second direction.

In an embodiment, a depth of the trenches is within a range from 100 angstroms to 700 angstroms.

In an embodiment, a depth of the trenches is within a range from 300 angstroms to 400 angstroms.

In an embodiment, a width of the trenches is equal to a distance between two adjacent trenches of the trenches.

In an embodiment, a width of the trenches is at least 250 nm.

In an embodiment, the step of performing the implantation on the substrate further includes forming a deep p-type well in the substrate, and the first doped line and the second doped line are formed in the deep p-type well.

In an embodiment, the first doped line is a p type, and the second doped line is an n type.

In an embodiment, the step of forming the gate structure line includes forming a gate insulation layer on the substrate and a gate line layer located on the gate insulation layer, and the gate insulation layer crosses over the trenches.

In an embodiment, the gate line layer is a polysilicon layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DETAILED DESCRIPTIONS OF EMBODIMENTS

The disclosure relates to a manufacturing technology of a semiconductor device; more particularly, the disclosure relates to a structure of metal-oxide semiconductor (MOS) transistor and a method of fabricating the same. In consideration of increasing an effective width of a gate, the disclosure provides a gate structure of a transistor extending in a width direction, having a concave portion down into the substrate, so as to increase an effective width of the gate.

Some embodiments are provided below to explain the invention; however, the invention is not limited by the embodiments. Besides, the exemplified embodiments may be properly combined and become another embodiment.

Here, methods of increasing the effective width of the gate are looked into. Normally, the gate on a planar surface of a substrate may extend straight along a channel width direction perpendicular to a channel length direction, so as to increase the effective width of the gate. In addition to the gate structure in a shape of a straight line at the width direction, another way to further increase the effective width of the gate is proposed in the disclosure.

Figure 1:
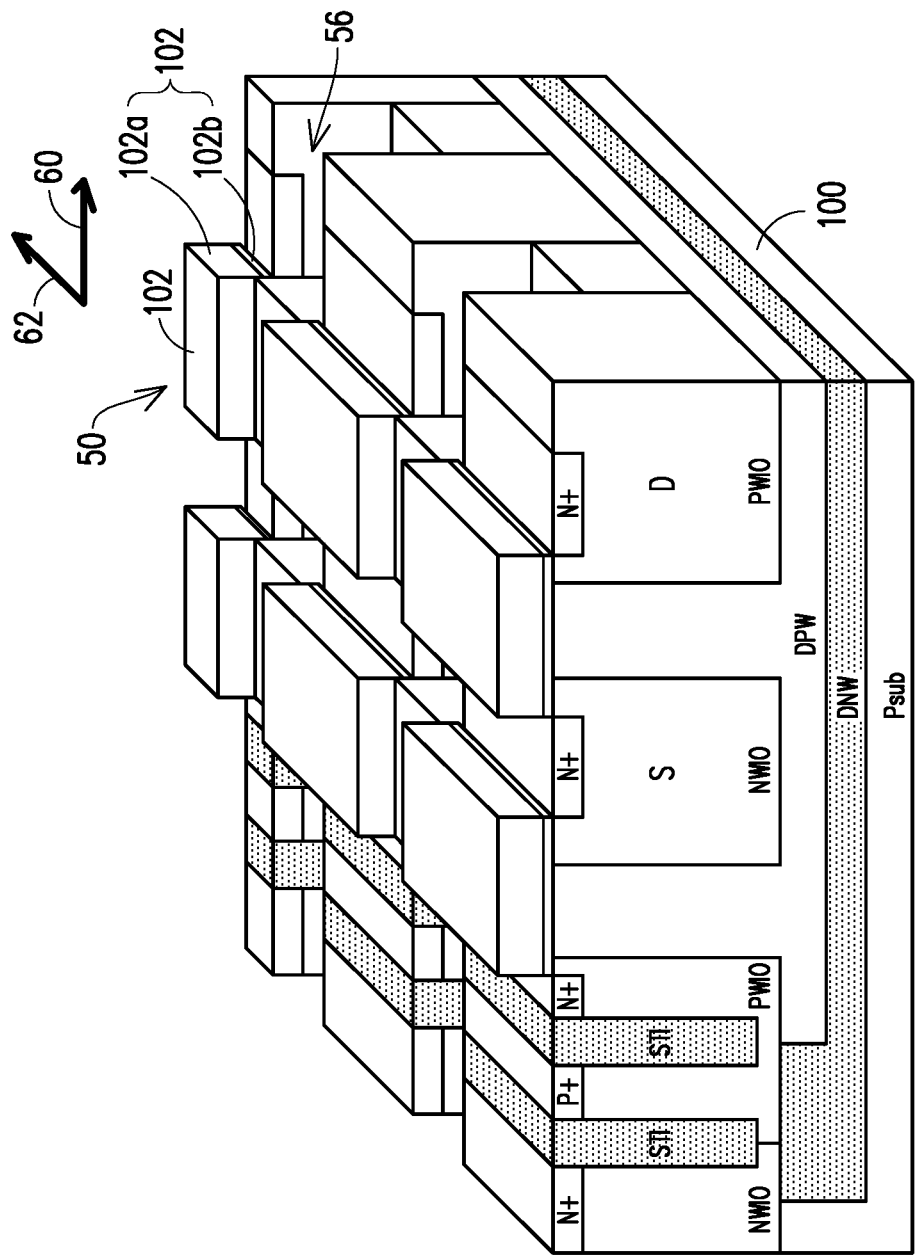
FIG. 1 is a schematic three-dimensional view of a structure of a MOS transistor according to an embodiment of the disclosure.

FIG. 1 is a schematic three-dimensional view of a structure of a metal-oxide-semiconductor (MOS) transistor according to an embodiment of the disclosure. With reference to FIG. 1, a substrate 100 serving as a base of the entire structure is a p-type substrate Psub. Plural p-type wells including deep p-type wells DPW or n-type wells including deep n-type wells DNW may be disposed in the substrate 100. Based on actual demands, n-type input/output (I/O) wells NWIO and p-type I/O wells PWIO which may act as a source S and a drain D of one transistor 50 may also be formed in the substrate 100. The substrate 100 includes a shallow trench isolation (STI) structure capable of performing an isolation function and an n-type or p-type heavily doped contact region 54 N+ or P+ configured to contact and connect external devices. Whether or not the doped regions are arranged in the substrate 100 is determined according to actual needs, and the doping manner exemplified herein should not be construed as a limitation in the disclosure.

Trenches 56 are also formed on a top portion of the substrate 100. The trenches 56 extend along a first direction 60. The transistor 50 further includes a gate structure line 102 on the substrate 100. The gate structure line 102 extends along a second direction 62 and crosses over the trenches 56. The first direction 60 intersects with the second direction 62 in a perpendicular manner, for instance. The gate structure line 102 includes a gate line layer 102a and a gate insulation layer 102b. The gate insulation layer 102b is located on the substrate 100 and also crosses over the trenches 56. The gate line layer 102a is located on the gate insulation layer 102b and also crosses over the trenches 56. The source S and the drain D are formed in the substrate 100 and located at two sides of the gate structure line 102. Here, the source S and the drain D are provided to better describe an embodiment; as a matter of fact, the source S and the drain D in operation may be exchanged. Both the structure of the source S and the structure of the drain D are linear doped regions according to an embodiment of the disclosure. A channel region is formed between the source S and the drain D on the surface of the substrate 100 under the gate, and a channel direction of the channel region is defined as the first direction 60. In response to the channel direction, a width of the gate structure line 102 extends in the second direction 62 perpendicular to the first direction 60. An effective length of the gate structure line 102 is the effective width of the gate.

In an embodiment, the trenches 56 are formed on the top portion of the substrate 100. When the gate structure line 102 crosses over the trenches 56, the gate structure line 102 becomes concave together with the trenches 56, so as to increase a total length of the gate structure line 102, i.e., increase the width of the gate. As such, when the transistor is turned on and is being operated, the current flowing through the channel region may be increased, so as to enhance the performance of the transistor; therefore, such a design may be applied to a high-voltage transistor.

Figure 2:
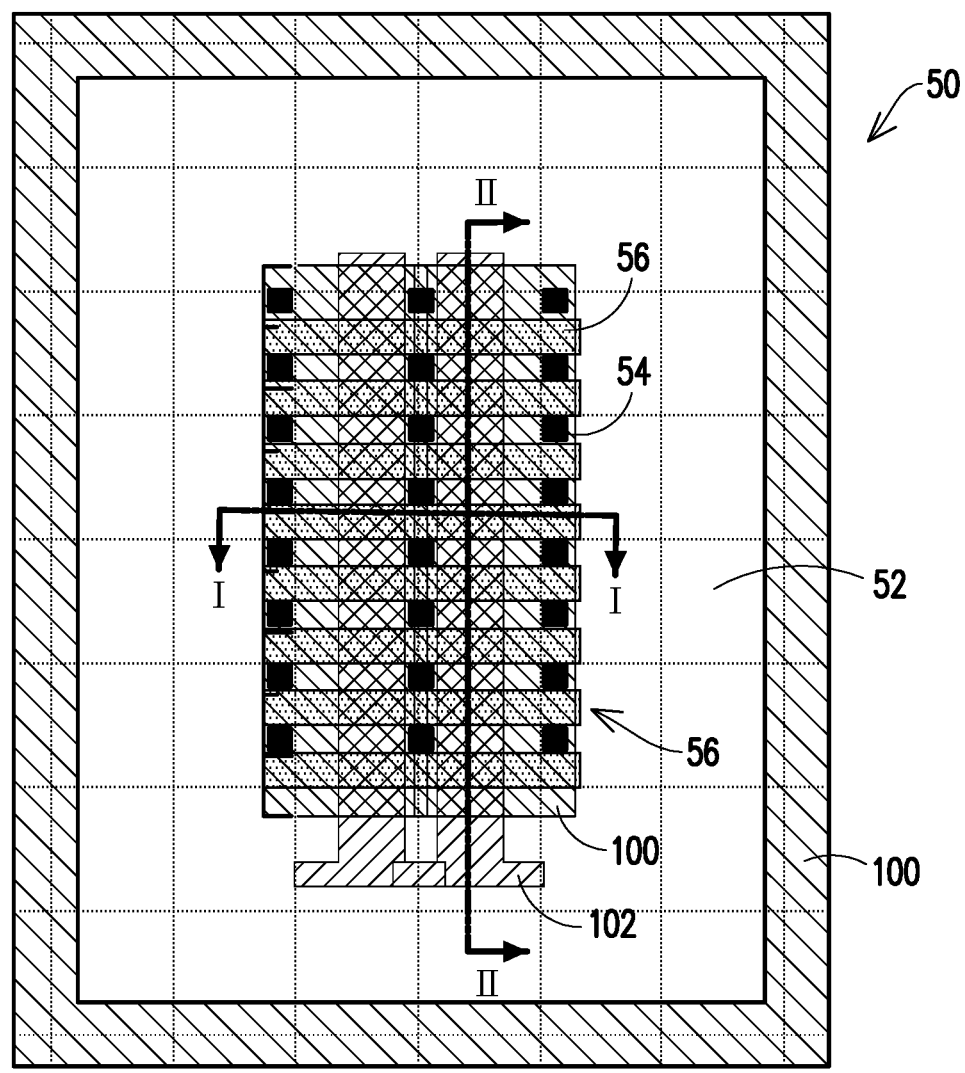
FIG. 2 is a schematic top view of a structure of a MOS transistor according to an embodiment of the disclosure.

The structure of the transistor 50 is further described below. FIG. 2 is a schematic top view of a structure of an MOS transistor according to an embodiment of the disclosure. With reference to FIG. 2 and also FIG. 1, the width of the gate structure increases in response to the MOS transistor 50 operating at the high voltage, so as to form the gate structure line 102. The gate structure line 102 extends along a cutting line II-II. A source and a drain are formed in the substrate 100 at both sides of the gate structure line 102. According to the embodiment, two transistors 50 are serially connected, for instance, which should however not be construed as a limitation in the disclosure. The substrate 100 serves as the base of the transistor 50. The trenches 56 are formed on the top portion of the substrate 100 and extend along a direction of a cutting line I-I. The contact regions 54 serving as contact points for subsequent external connection are formed at two sides of the trenches 56. The peripheries of the transistor 50 are isolated by an isolation structure 52, which is a STI structure, for instance.

Figure 3:
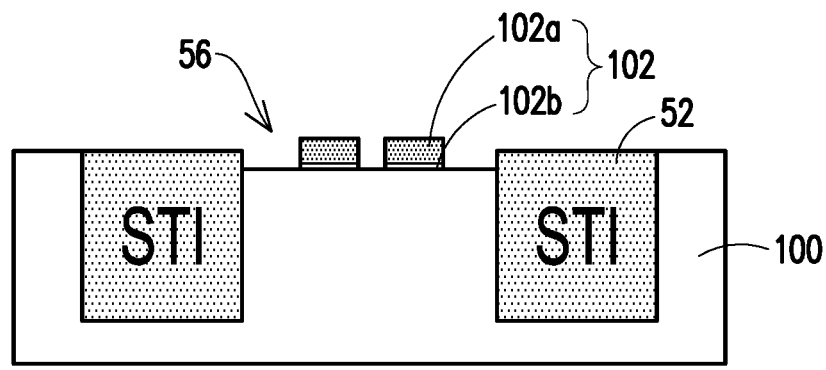
FIG. 3 is a schematic cross-sectional view of the MOS transistor depicted in FIG. 1 along a cutting line I-I according to an embodiment of the disclosure.

FIG. 3 is a schematic cross-sectional view of the MOS transistor depicted in FIG. 1 along a cutting line I-I according to an embodiment of the disclosure. With reference to FIG. 3, the cutting line I-I cuts through the trenches 56; hence, on the cross-sectional structure, the height of the substrate 100 between the isolation structure 52 appears to be a recess, which is determined according to the depth of the trenches 56. The gate structure line 102 crosses over the trenches 56 and is thus located at a bottom portion of the trenches 56.

Figure 4:
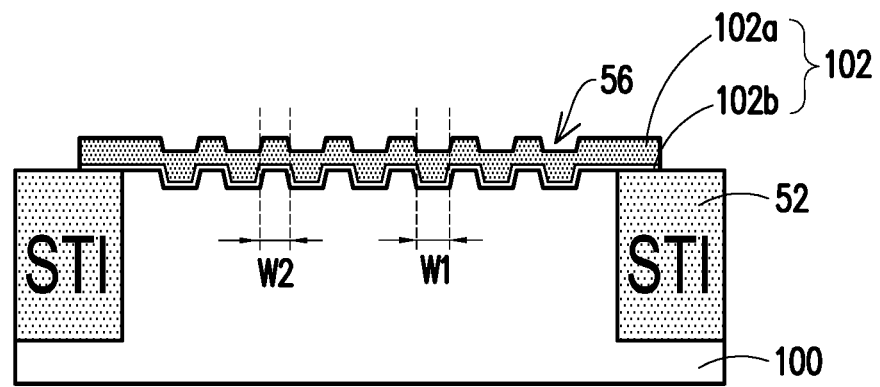
FIG. 4 is a schematic cross-sectional view of the MOS transistor depicted in FIG. 1 along a cutting line II-II according to an embodiment of the disclosure.

FIG. 4 is a schematic cross-sectional view of the MOS transistor depicted in FIG. 1 along a cutting line II-II according to an embodiment of the disclosure. With reference to FIG. 4, the cutting line II-II cuts through the gate structure line 102. Since the trenches 56 are formed on the substrate 100, the gate structure line 102 forms a concave structure at the trenches 56, and the concave structure includes contact regions on sidewalls of the trenches 56, whereby an area where the gate structure line 102 and the substrate 100 are contacted is increased. The channel region is formed in the contact area. Accordingly, the effective width of the gate structure line 102 may be increased.

In general, the greater the depth of the trenches 56, the more the increased effective width. However, it is rather difficult to fabricate the trenches with the large depth. In an embodiment, the depth of the trenches 56 is within a range from 100 angstroms to 700 angstroms, for instance. In an embodiment, the depth of the trenches is within a range from 300 angstroms to 400 angstroms, for instance. In an embodiment, a width W1 of the trenches is equal to a distance W2 between two adjacent trenches, and the distance W2 is at least 250 nm. In an embodiment, the width of the trenches is at least 250 nm, for instance.

Figure 5A:
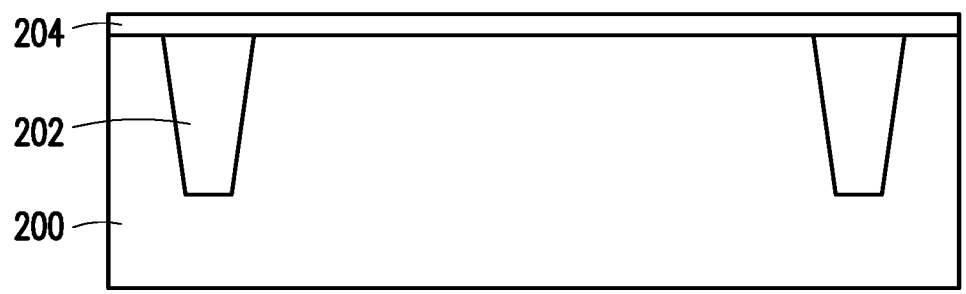
FIG. 5A to FIG. 5O are schematic cross-sectional views illustrating a method of fabricating an MOS transistor according to an embodiment of the disclosure.
Figure 5B:
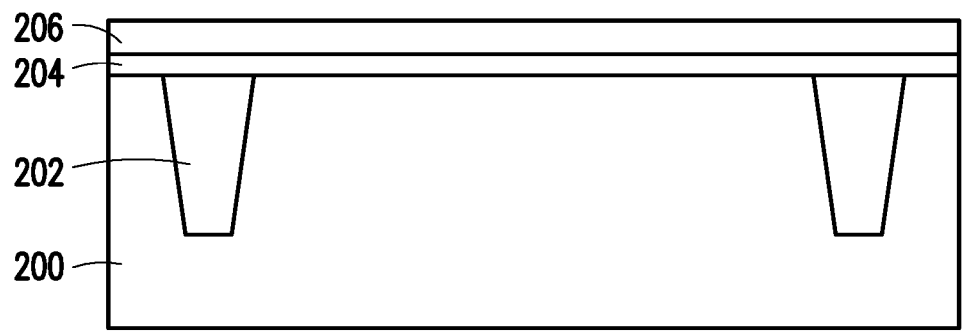
Figure 5C:
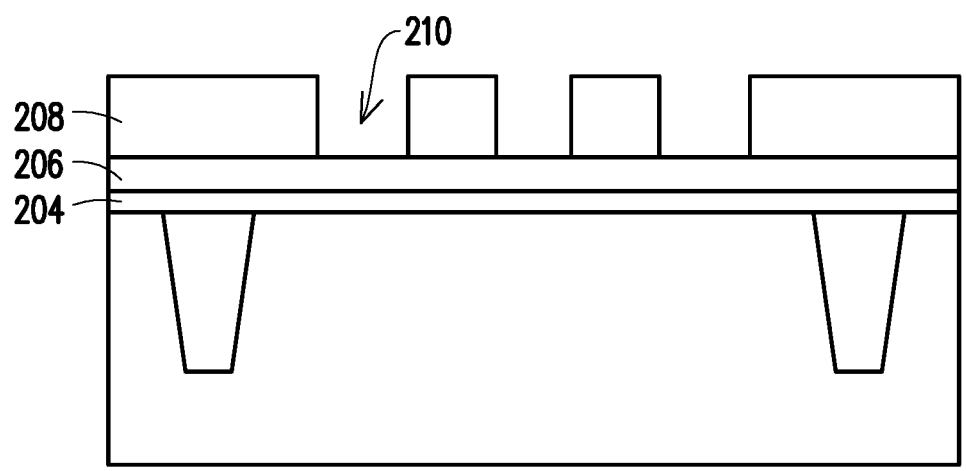
Figure 5D:
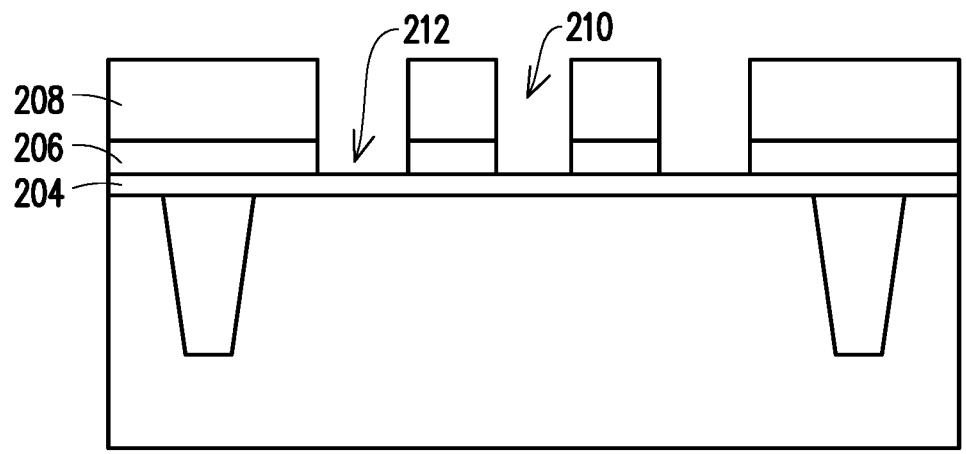

A process of fabricating the transistor is described below. FIG. 5A to FIG. 5O are schematic cross-sectional views illustrating a method of fabricating an MOS transistor according to an embodiment of the disclosure.

With reference to FIG. 5A, an isolation structure 202 is formed on the substrate 200 to isolate subsequently formed devices, e.g., a transistor device. A pad oxide layer 204 is formed on the substrate 200. With reference to FIG. 5B, a nitride layer 206 is formed on the pad oxide layer 204. With reference to FIG. 5C, a photoresist layer 208 is formed on the nitride layer 206. The photoresist layer 208 has an opening 210 which exposes a portion of the nitride layer 206. With reference to FIG. 5D, an etching process is performed on the nitride layer 206 in response to the opening 210 with use of the photoresist layer 208 as the etching mask, so as to form an opening 212 of the nitride layer 206 exposing a portion of the pad oxide layer 204.

Figure 5E:
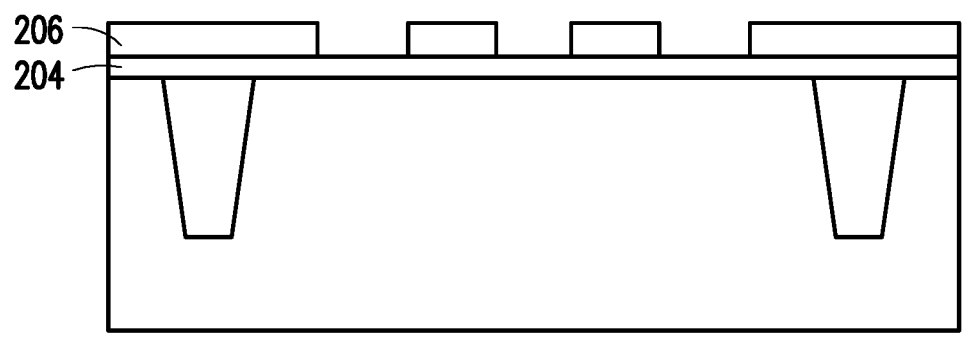
Figure 5F:
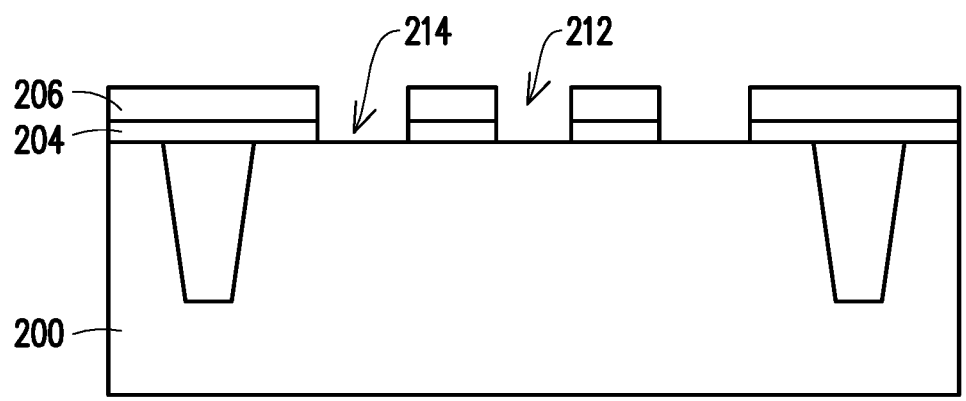

With reference to FIG. 5E, the photoresist layer 208 is removed, and the nitride layer 206 and the pad oxide layer 204 are kept. With reference to FIG. 5F, a cleansing process, e.g., a standard RCA cleaning process, is performed with use of oxide to remove the pad oxide layer 204 exposed by the opening 212 of the nitride layer 206. As such, an opening 214 is formed in the nitride layer 206 and the pad oxide layer 204 and exposes a portion of the substrate 200.

Figure 5G:
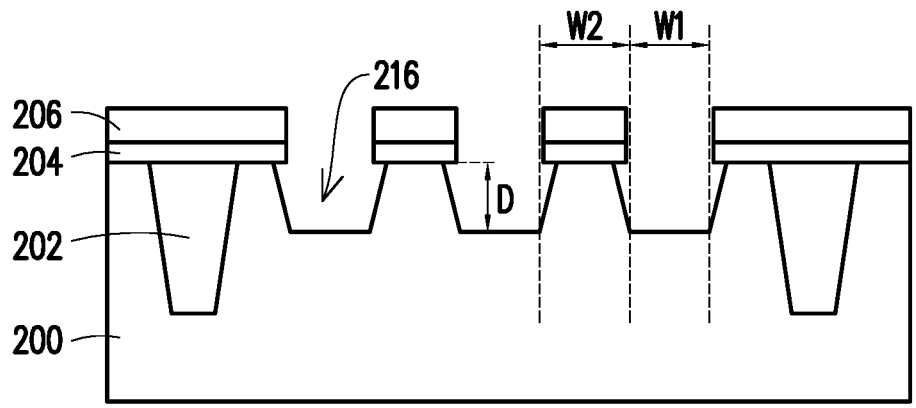

With reference to FIG. 5G, since the opening 214 is formed in the nitride layer 206 and the pad oxide layer 204, an etching process is performed on the exposed portion of the substrate 200, so as to obtain a plurality of trenches 216 on the top portion of the substrate 200. As depicted in FIG. 4 and described above, the depth D of the trenches 216 is within a range from 100 angstroms to 700 angstroms, for instance. The width W1 of the trenches 216 is at least 250 nm, for instance. The distance W2 between two adjacent trenches is at least 250 nm, for instance. In an embodiment, the width W1 and the distance W2 are equal and evenly distributed, for instance.

Figure 5H:
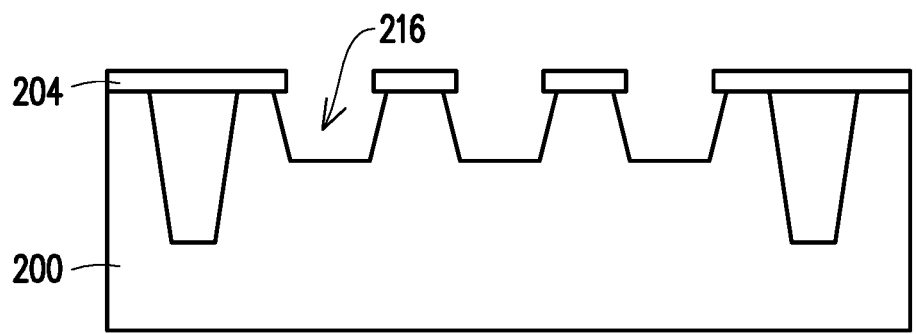
Figure 5I:
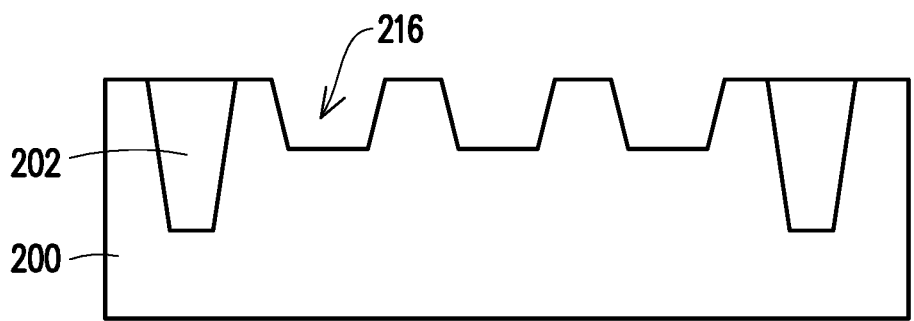

With reference to FIG. 5H, after the structure of the trenches 216 is completely formed, the nitride layer 206 whose material is different from that of the pad oxide layer 204 may be removed according to an embodiment of the disclosure, while the pad oxide layer 204 is kept on the substrate 200. With reference to FIG. 5I, according to an embodiment, a cleaning process is performed to remove the pad oxide layer 204 and expose the substrate 200.

Figure 5J:
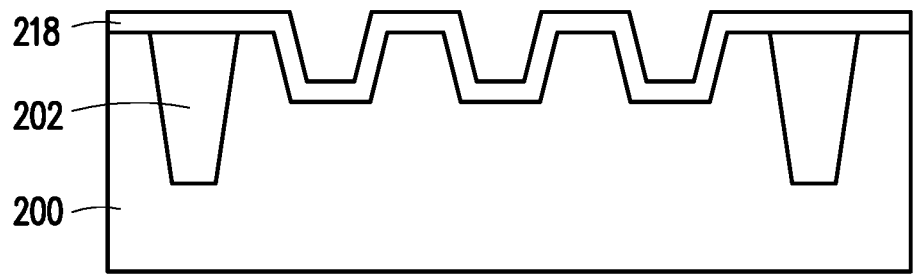
Figure 5K:
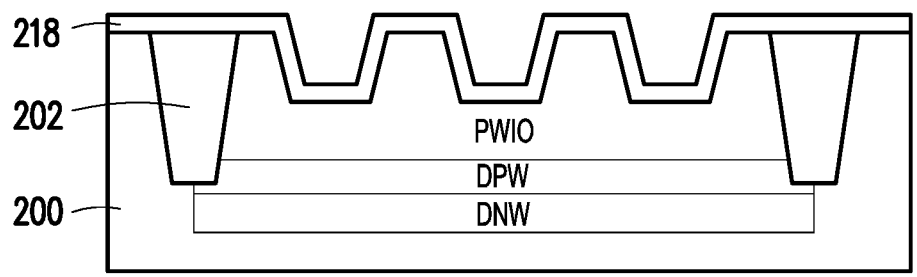
Figure 5L:
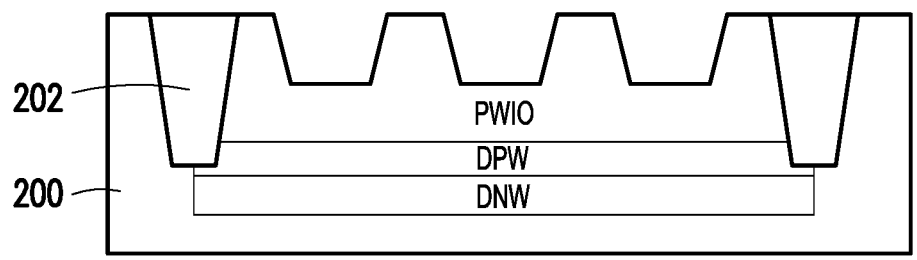

With reference to FIG. 5J, another pad oxide layer 218 is formed on the substrate 200 to protect the subsequent implantation process. With reference to FIG. 5K, the implantation process is performed to form the desired doped regions in the substrate 200, and the desired doped regions include, for instance, the deep n-type well DNW, the deep p-type well DPW, the p-type I/O well PWIO, and so forth. The structure depicted in FIG. 1 may be taken as a reference. Here, the implantation process is schematically performed to indicate that the desired doped regions are formed in the substrate 200, and the actual implantation process may also be performed at other proper stages of the fabricating process. The implementation of the implantation process is not limited in the disclosure. With reference to FIG. 5L, after the implantation process is completed, the pad oxide layer 218 is removed to expose the substrate 200.

Figure 5M:
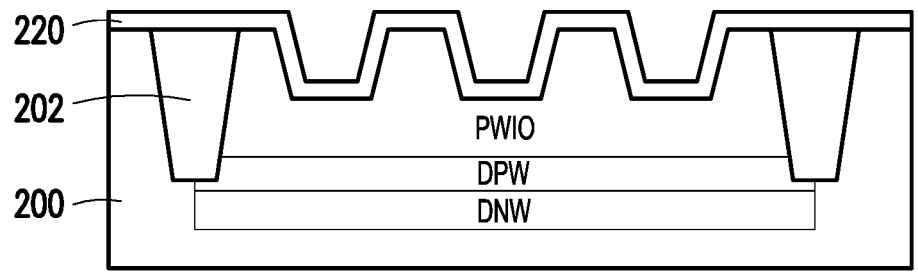
Figure 5N:
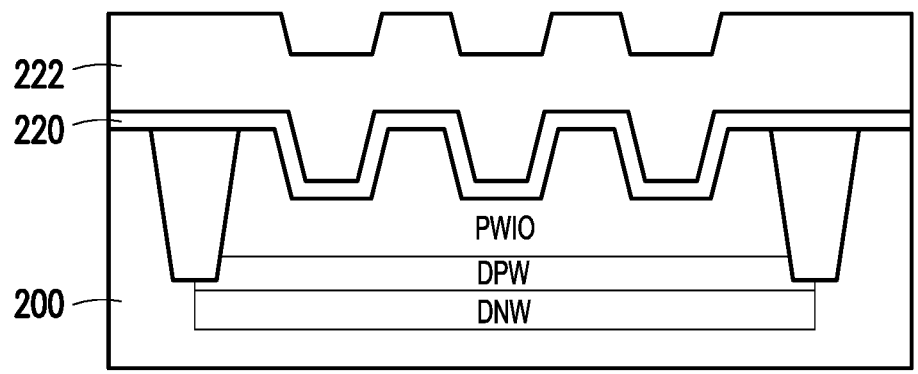
Figure 5O:
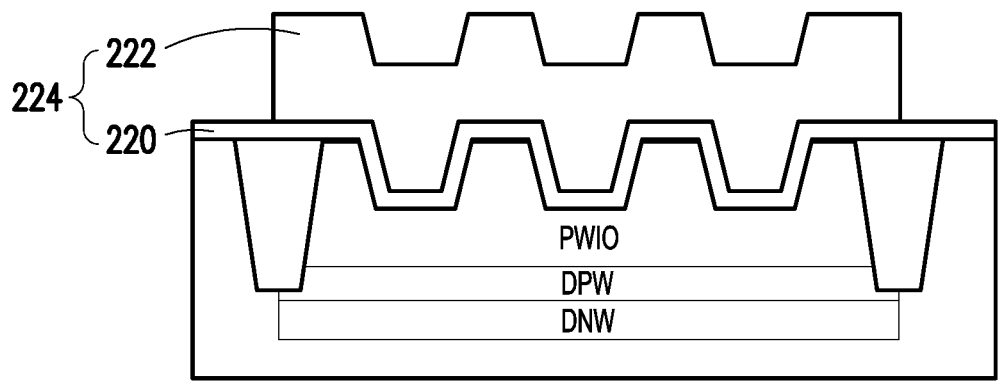

With reference to FIG. 5M, the gate insulation layer 220 is again formed on the substrate 200 and covers the trenches 216. With reference to FIG. 5N, the gate layer 222 is also formed on the gate insulation layer 220. A material of the gate layer 222 is, for instance, polysilicon. In an embodiment, a doping process may also be performed on the gate layer 222 according to the desired conductivity type. With reference to FIG. 5O, the gate layer 222 is defined in an embodiment, so as to obtain the desired gate line structure 224. Other steps may be subsequently performed to form the desired structure. The subsequently performed steps should not be construed as a limitation in the disclosure and thus will not be further described.

In the gate line structure 224 provided in one or more embodiments of the disclosure, the effective width of the gate is increased by forming the trenches 216 on the substrate 200, which at least may increase the operating current of the transistor.

It will be apparent to those skilled in the art that various modifications and variations may be made to the structure provided in the disclosure without departing from the scope or spirit indicated herein. In view of the foregoing, it is intended that the disclosure cover modifications and variations provided they fall within the scope of the following claims and their equivalents.

What is claimed is:

1. A metal-oxide semiconductor transistor comprising:
a substrate having a plurality of trenches located on a top portion of the substrate and extending along a first direction;
a gate structure line located on the substrate, extending along a second direction intersecting with the first direction, and crossing over the plurality of trenches;
a first doped line located in the substrate, located at a first side of the gate structure line, and crossing and under the plurality of trenches; and
a second doped line located in the substrate, located at a second side of the gate structure line, and crossing and under the plurality of trenches,
wherein a width of the plurality of trenches is equal to a distance between two adjacent trenches of the plurality of trenches.

2. The metal-oxide semiconductor transistor according to claim 1, wherein the first direction is perpendicular to the second direction.

3. The metal-oxide semiconductor transistor according to claim 1, wherein a depth of the plurality of trenches is within a range from 100 angstroms to 700 angstroms.

4. The metal-oxide semiconductor transistor according to claim 1, wherein a depth of the plurality of trenches is within a range from 300 angstroms to 400 angstroms.

5. The metal-oxide semiconductor transistor according to claim 1, wherein a width of the plurality of trenches is at least 250 nm.

6. The metal-oxide semiconductor transistor according to claim 1, wherein the substrate comprises a deep p-type well, and the first doped line and the second doped line are formed in the deep p-type well.

7. The metal-oxide semiconductor transistor according to claim 1, wherein the first doped line is a p type, and the second doped line is an n type.

8. The metal-oxide semiconductor transistor according to claim 1, the gate structure line comprising:
a gate insulation layer located on the substrate; and
a gate line layer located on the gate insulation layer.

9. The metal-oxide semiconductor transistor according to claim 8, wherein the gate line layer is a polysilicon layer.

10. A method of fabricating a metal-oxide-semiconductor transistor, comprising:
providing a substrate, the substrate having a plurality of trenches extending along a first direction and located on a top portion of the substrate;
forming a gate structure line on the substrate, the gate structure line extending along a second direction intersecting with the first direction and crossing and under the plurality of trenches; and
performing implantation on the substrate to form a first doped line and a second doped line in the substrate, the first doped line and the second doped line extending along the second direction intersecting with the first direction and crossing and under the plurality of trenches, wherein the first doped line is located at a first side of the gate structure line, and the second doped line is located at a second side of the gate structure line,
wherein a width of the plurality of trenches is equal to a distance between two adjacent trenches of the plurality of trenches.

11. The method of fabricating the metal-oxide-semiconductor transistor according to claim 10, wherein the first direction is perpendicular to the second direction.

12. The method of fabricating the metal-oxide-semiconductor transistor according to claim 10, wherein a depth of the plurality of trenches is within a range from 100 angstroms to 700 angstroms.

13. The method of fabricating the metal-oxide-semiconductor transistor according to claim 10, wherein a depth of the plurality of trenches is within a range from 300 angstroms to 400 angstroms.

14. The method of fabricating the metal-oxide-semiconductor transistor according to claim 10, wherein a width of the plurality of trenches is at least 250 nm.

15. The method of fabricating the metal-oxide-semiconductor transistor according to claim 10, wherein the step of performing the implantation on the substrate further comprises: forming a deep p-type well in the substrate, wherein the first doped line and the second doped line are formed in the deep p-type well.

16. The method of fabricating the metal-oxide-semiconductor transistor according to claim 10, wherein the first doped line is a p type, and the second doped line is an n type.

17. The method of fabricating the metal-oxide-semiconductor transistor according to claim 10, wherein the step of forming the gate structure line comprises:
forming a gate insulation layer on the substrate, the gate insulation layer crossing over the plurality of trenches; and
forming a gate line layer on the gate insulation layer.

18. The method of fabricating the metal-oxide-semiconductor transistor according to claim 17, wherein the gate line layer is a polysilicon layer.

* * * * *